United States Patent
Terao

[11] Patent Number: 6,114,867
[45] Date of Patent: Sep. 5, 2000

[54] DEVICE TESTING APPARATUS

[75] Inventor: Masashi Terao, Tokyo, Japan

[73] Assignee: Ando Electric Co., Ltd., Tokyo, Japan

[21] Appl. No.: 09/150,561

[22] Filed: Sep. 10, 1998

[30] Foreign Application Priority Data

Sep. 18, 1997 [JP] Japan .................................. 9-253939

[51] Int. Cl.⁷ .................................................. G01R 31/02
[52] U.S. Cl. ........................................... 324/760; 324/765
[58] Field of Search ................................. 324/760, 765; 361/676, 677, 678; 165/80.3, 80.4; 219/209

[56] References Cited

U.S. PATENT DOCUMENTS

4,145,620 3/1979 Dice ........................................ 307/149
5,528,161 6/1996 Liken et al. ............................. 324/760

*Primary Examiner*—Safet Metjahic
*Assistant Examiner*—Russell M. Kobert
*Attorney, Agent, or Firm*—Fish & Richardson P.C.

[57] ABSTRACT

The present invention relates to a device testing apparatus used for screening testing of semiconductor devices and the like, and having a constant temperature oven in which a through hole is formed passing from an outer wall to an inner wall, for maintaining an inner space at a constant temperature, and a test burn-in board on which a plurality of devices to be tested are mounted, provided inside the constant temperature oven. A first card has a plurality of first signal lines for inputting a signal to be supplied to the device to be tested, formed on a surface thereof, and there is provided a first male connector attached to one edge of the first card and connected to the plurality of first signal lines. Furthermore, there is provided a first female connector attached to one face of a mother board, for fitting into the first male connector, and a second female connector attached to the other face of the mother board opposite to the first female connector, and connected to the first female connector via a plurality of pins. Moreover, a second card inserted through the through hole of the constant temperature oven has a plurality of second signal lines connected to the device to be tested formed on a surface thereof, and there is provided a second male connector attached to one edge of the second card and connected to the second signal lines, and fitted into the second female connector.

10 Claims, 6 Drawing Sheets

DEVICE TESTING APPARATUS

BACKGROUND OF THE INVENTION

1. Field of the invention

The present invention relates to a device testing apparatus used for example in screening testing of semiconductor devices and the like.

This application is based on patent application No. Hei 9-253939 filed in Japan, the content of which is incorporated herein by reference.

2. Description of the Related Art

Heretofore, screening testing of semiconductor devices and the like is carried out using a device testing apparatus such as a burn-in apparatus, a test burn-in apparatus, a static burn-in apparatus, a dynamic burn-in apparatus, or a monitored burn-in apparatus.

Here the above-mentioned burn-in apparatus are for removing devices in which time and stress dependent faults occurs due to inherently defective semiconductor devices or to deviations in manufacture. The test burn-in apparatus is a burn-in apparatus having a function for judging if the semiconductor device is good or bad. The static burn-in apparatus is one which applies a rated voltage or a voltage exceeding this to the semiconductor device while under a high temperature, to thereby apply thermal and voltage stresses to the semiconductor device.

The dynamic burn-in apparatus is one which applies a rated voltage or a voltage exceeding this to the semiconductor device while at a constant temperature, and inputs to the input circuit of the semiconductor device a signal close to an actual operating signal. The monitored burn-in apparatus is a dynamic burn-in apparatus having a function for judging if the semiconductor device is good or bad, where not only is a signal input to the input circuit of the semiconductor device, but also the characteristics of the output circuit are monitored.

Figure 4:
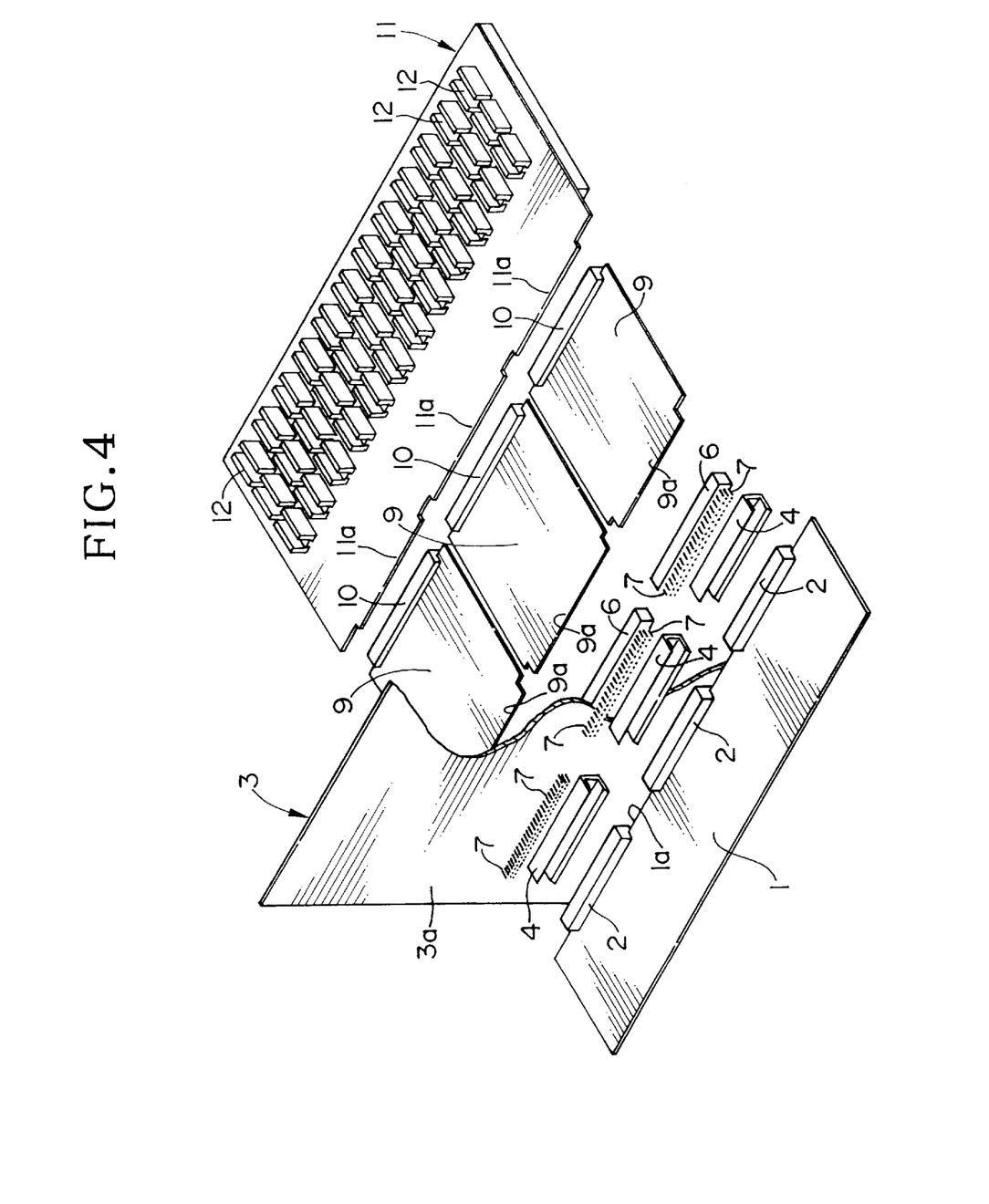
FIG. 4 is a partially cut away perspective view showing the construction of a conventional device testing apparatus.
Figure 5:
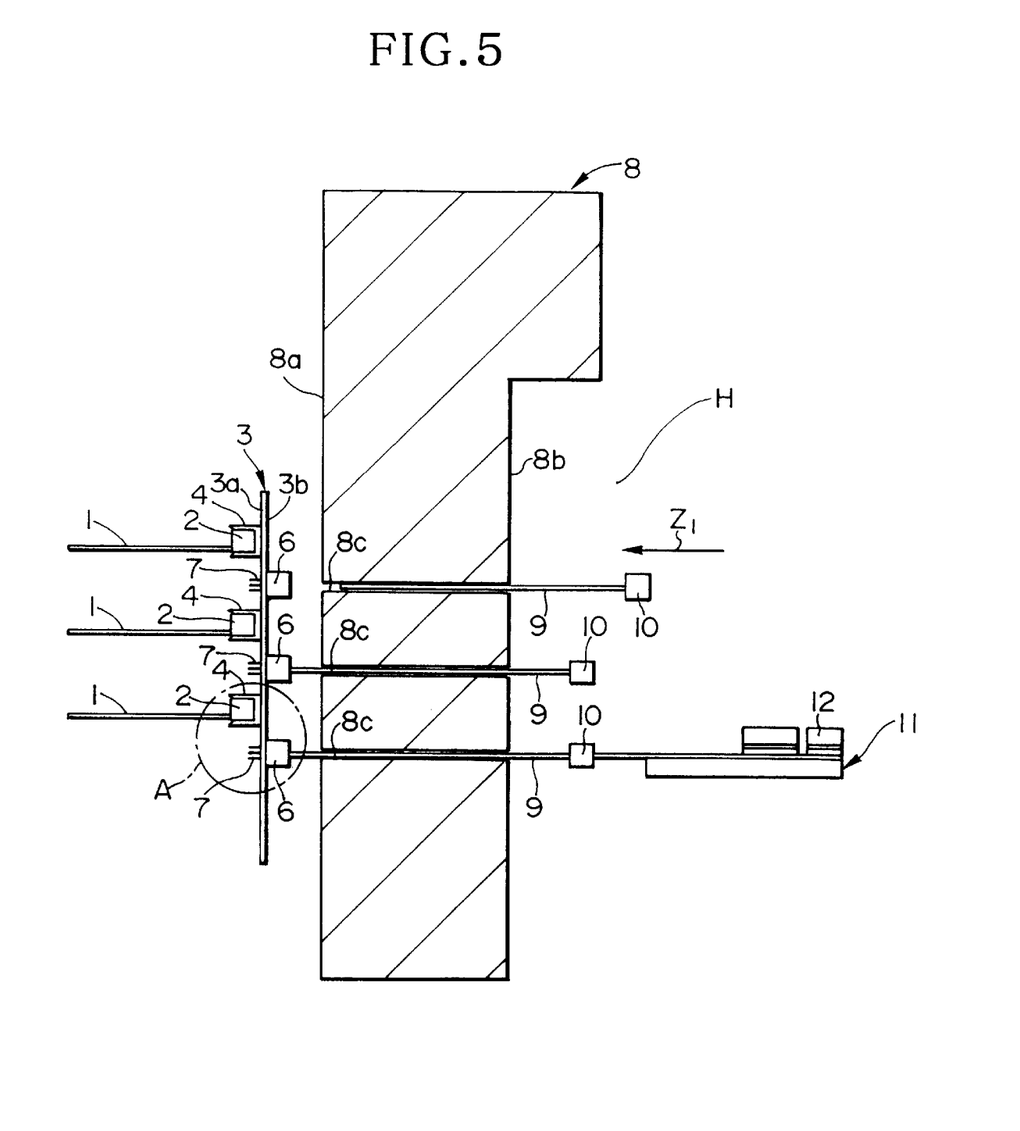
FIG. 5 is a side sectional view showing the construction of the conventional device testing apparatus.
Figure 6:
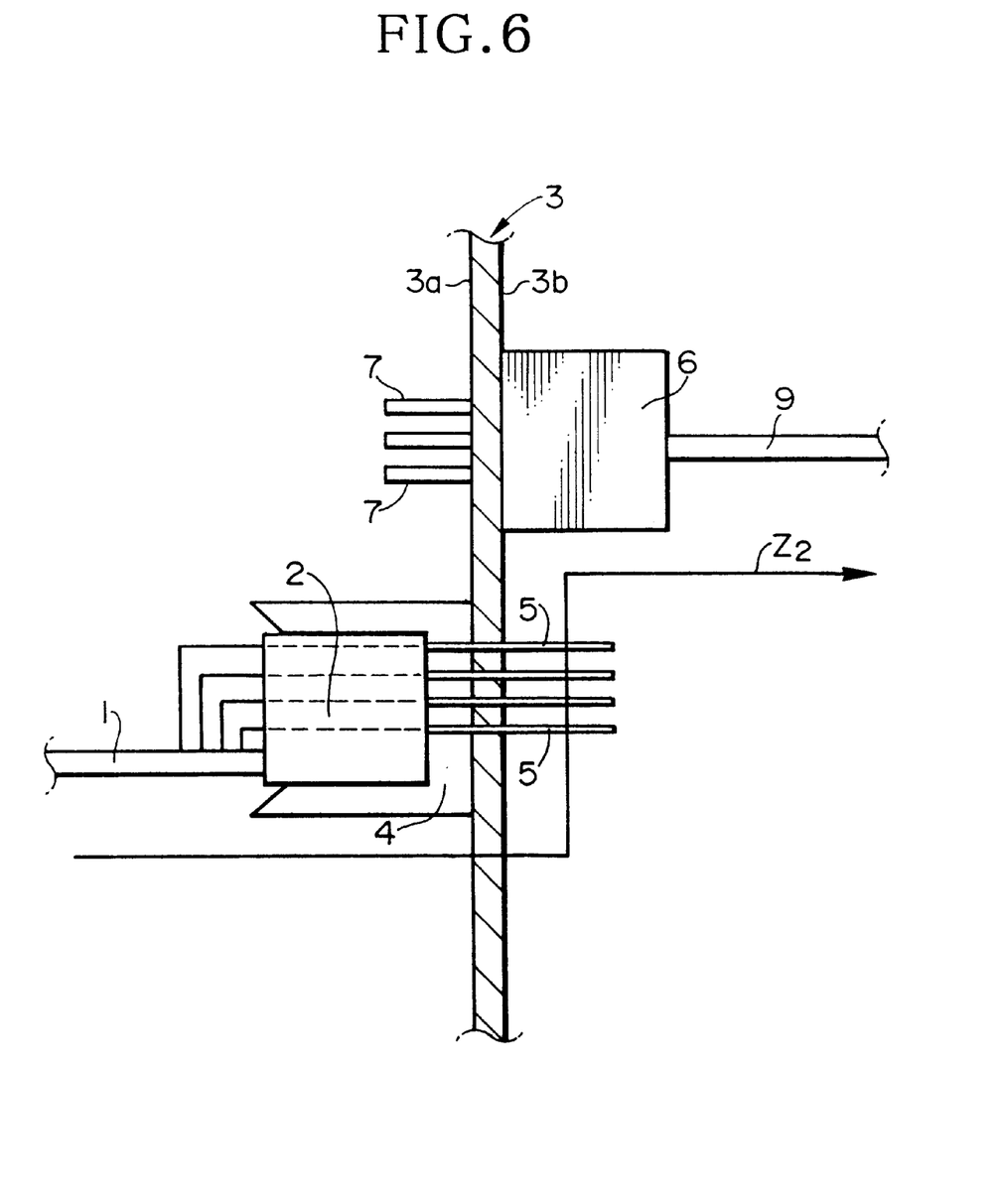
FIG. 6 is an enlarged side view showing the construction inside circle A in FIG. 5.

FIG. 4 is a partially cut away perspective diagram showing the construction of the main elements of the above-mentioned conventional device testing apparatus, and FIG. 5 is a side sectional view showing the construction of the main elements of the conventional device testing apparatus. Furthermore, FIG. 6 is an enlarged sectional view showing the construction inside the circle A of FIG. 5.

Numeral 1 in FIG. 4 denotes a DRV/CMP (driver/comparator) card having a plurality of signal lines for transmitting signals and the like, formed on a surface thereof. Numerals 2 denote a plurality of rectangular parallelepiped shaped male connectors respectively attached at predetermined spacing to one edge 1a of the DRV/CMP card 1. Here the male connector 2 is defined as a connector for which the molded shape is that of a male connector.

Numeral 3 denotes a motherboard disposed perpendicular to the DRV/CMP card 1. Numerals 4 denote a plurality of female connectors of C-shape in cross-section respectively provided corresponding to the male connectors 2, and respectively attached at a uniform spacing to one face 3a of the mother board 3. Here the female connector 4 is defined as a connector for which the molded shape is that of a female connector.

When the female connectors 4 are made up with three in a group, three groups are attached one above the other to the one face 3a of the mother board 3 as shown in FIG. 5. Furthermore as shown in FIG. 6, the female connectors 4 have a plurality of pins 5, and these pins 5 are respectively provided so as to pass through the motherboard 3. At the time of inserting the DRV/CMP card 1, the male connectors 2 fit into the female connectors 4.

Numerals 6 in FIG. 4 denote a plurality of edge connectors constituting female connectors provided respectively corresponding to the female connectors 4, and are respectively attached at uniform spacing to the other side 3b of the mother board 3. The edge connectors 6 are each formed with sockets (not shown in the figure).

When the edge connectors 6 are made up with three in a group, three groups are attached one above the other to the other face 3b of the mother board 3 as shown in FIG. 5, at positions one step lower than the female connectors 4. Furthermore as shown in FIG. 6, the edge connectors 6 have a plurality of pins 7, and these pins 7 are respectively provided so as to pass through the mother board 3, and so as to respectively connect electrically to the pins 5 via a plurality of signal lines (not shown in the figure) respectively formed on the other face 3b of the mother board 3.

Numeral 8 in FIG. 5 denotes a constant temperature oven provided close to the motherboard 3, for maintaining an interior space H thereof at a constant temperature. In FIG. 5 a part of the constant temperature oven 8 is shown, while in FIG. 4 the drawing for the constant temperature oven 8 is omitted.

Thin wide through holes 8c are respectively formed one above the other in the constant temperature oven 8, passing from the outer wall 8a to the inner wall 8b at locations respectively corresponding to the edge connectors 6.

Numerals 9 in FIG. 4 denote feed through boards provided corresponding respectively to the edge connectors 6, with one end 9a corresponding to the edge connectors 6 formed as a tongue. The one ends 9a of the feed through boards 9 are inserted into the edge connectors 6 shown in FIG. 6. The plate thickness of the feed through boards 9 is made slightly less than the vertical dimension (in FIG. 5) of the through holes 8c in FIG. 5.

The other ends of the feed through boards 9 shown in FIG. 4 are respectively fitted with edge connectors 10 having sockets (not shown in the figure). The edge connectors 10 are respectively connected electrically to the one ends 9a by signal lines formed on the respective surfaces of the feed through boards 9.

Numeral 11 denotes a test burn-in board which is slightly wider than the three feed through boards 9 arranged side by side, and which is disposed in the internal space H of the constant temperature oven 8 (refer to FIG. 5). At the time of testing, a plurality of devices 12 to be tested are mounted on the surface of the test burn-in board 11.

Tongues 11a are respectively formed on one end of the test burn-in board 11 at positions respectively corresponding to the edge connectors 10.

Next is a description of the operation of the above described conventional device testing apparatus. In FIG. 4, the male connectors 2 of the DRV/CMP card 1 are respectively fitted into the female connectors 4.

As a result, the DRV/CMP CARD 1 is supported relative to the mother board 3, and the signal lines formed on the surface of the DRV/CMP CARD 1 shown in FIG. 6, are electrically connected to the edge connector 6 via the male connectors 2, the female connectors 4, the pins 5, and the signal lines formed on the other face 3b of the mother board 3.

Furthermore, the other DRV/CMPs 1 shown in FIG. 5 are also respectively supported relative to the motherboard 3.

After this, the upper stage ones of feed through boards 9 shown in FIG. 5 are inserted in the direction of arrow Z1 in FIG. 5, into the through holes 8c from the inner wall 8b side of the constant temperature oven 8. Then the one ends 9a, (refer to FIG. 4) of the feed through boards 9 are inserted into the edge connectors 6.

As a result the feed through boards 9 are supported relative to the other face 3b of the mother board 3, and the edge connectors 10 are electrically connected to the signal lines shown in FIG. 6 formed on the surface of the DRV/CMP card 1, via the signal lines formed on the surface of the feed through boards 9, the edge connectors 6, the pins 7, the signal lines formed on the other face 3b of the mother board 3, the pins 5, the female connectors 4, and the male connectors 2.

The tongues 11a of the test burn-in board 11 shown in FIG. 4 are then respectively inserted into the edge connectors 10. As a result, the devices to be tested 12 are respectively connected electrically to the edge connectors 10 via signal lines formed on the surface of the test burn-in board 11.

In this connected condition, when a signal is supplied from a signal generator (not shown in the figure) to the signal lines formed on the surface of the DRV/CMP card 1, the signal is supplied to the devices to be tested 12 by way of a path Z2 shown in FIG. 6.

Figure 1:
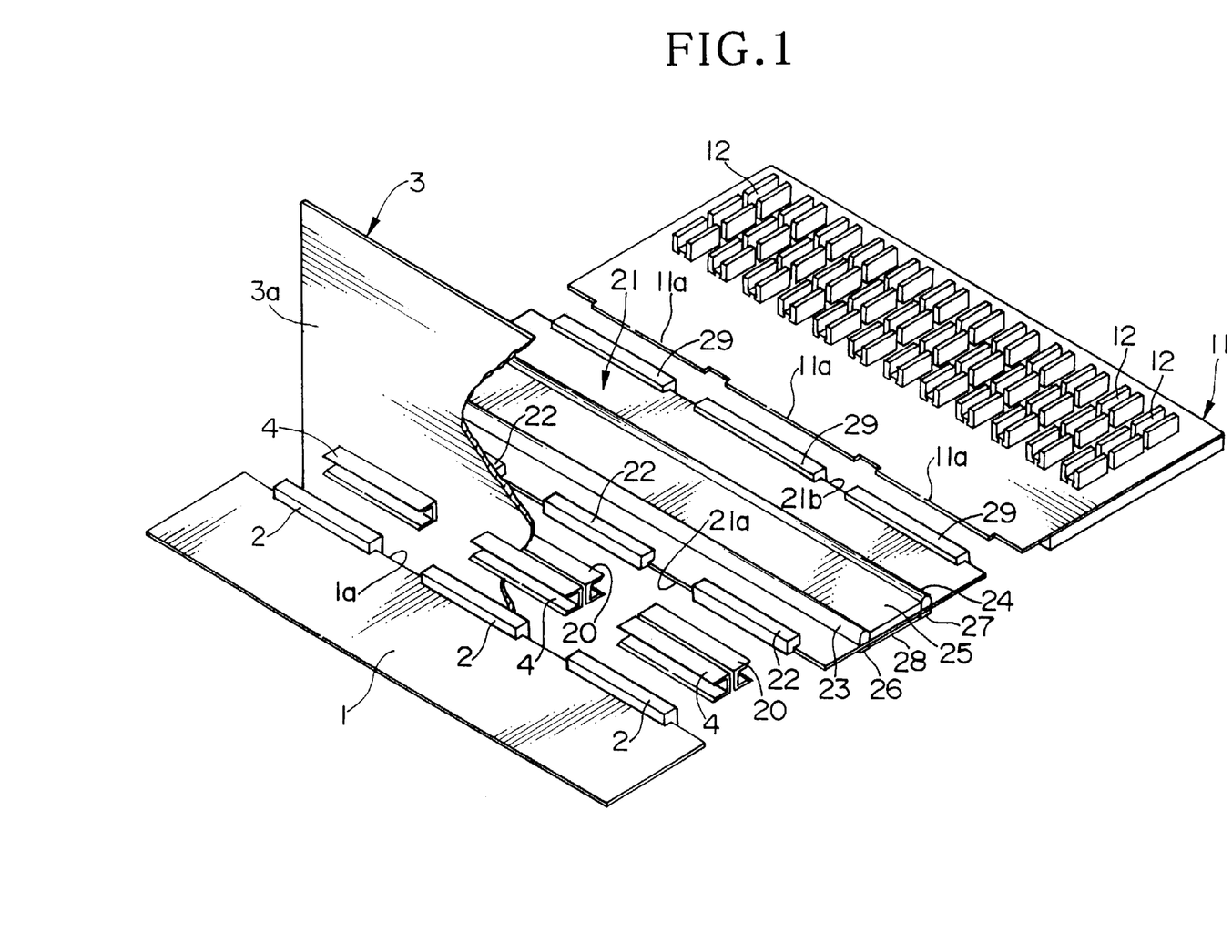
FIG. 1 is a partially cut away perspective view showing the construction of the main parts of a device testing apparatus according to an embodiment of the present invention.

That is to say, the signal is supplied to the devices to be tested 12 via as shown in FIG. 6, the signal lines formed on the surface of the DRVICMP card 1, the male connectors 2, the female connectors 4, the pins 5, the signal line formed on the other face 3b of the mother board 3, the pins 7, the edge connectors 6, the signal lines formed on the surface of the feed through boards 9, the edge connectors 10 shown in FIG. 1, and the signal lines formed in the surface of the test burn-in board 11. In this way, testing is carried out with respect to the devices to be tested 12.

Incidentally, with the conventional device testing apparatus, from the point of testing efficiency, it is desirable to have as many as possible devices to be tested 12 mounted on the test burn-in board 11 within a range permitted by space.

However, with the conventional device testing apparatus, since the edge connectors 6 are used, only connections for a plurality of signal lines in a one dimensional array is possible. Hence there is inevitably a limit to the number of signals which can be supplied from the DRV/CMP card 1 via the feed through boards 9 to the test burn-in board 11.

Consequently, with the conventional device testing apparatus, since edge connectors 6 which can only connect to signal lines in a one dimensional array are used, then an increase in the number of signals which can be handled, and modification to the signal line array is not physically possible, and hence extendibility is limited.

Moreover, with the conventional device testing apparatus, there are cases where due to structural accuracy and the contact surface condition of the edge connectors 6 and the one ends 9a of the feed through boards 9, the reliability of the contact between the one ends 9a of the feed through boards 9 and the edge connectors 6 is low.

Furthermore, with the conventional device testing apparatus, since the path Z2 for the signal as shown in FIG. 6 is not straight, the signal transmission distance is increased.

As a result, with the conventional device testing apparatus, the delay time increases due to the delay occurring in the signal transmission, and the line capacity is increased, so that signal transmission characteristics are poor.

In addition, with the conventional device test apparatus, since a small gap occurs between the through holes 8c of the constant temperature oven 8 and the feed through boards 9, there is the problem that the air tightness and the insulation properties between the inner space H and the outer space cannot be maintained.

SUMMARY OF THE INVENTION

Under the above background, it is an object of the present invention to provide a device testing apparatus which can improve both the extendibility of the signal, and the contact reliability at the time of connecting a connector, and which can also improve the signal transmission characteristics.

Accordingly with the present invention, there is provided a device testing apparatus of the following construction, having a constant temperature oven in which a through hole is formed passing from an outer wall to an inner wall, for maintaining an inner space at a constant temperature, and a test burn-in board on which a plurality of devices to be tested are mounted, provided inside the constant temperature oven. A first card has a plurality of first signal lines for inputting a signal to be supplied to the device to be tested, formed on a surface thereof, and there is provided a first male connector attached to one edge of the first card and connected to the plurality of first signal lines. Furthermore, there is provided a first female connector attached to one face of a mother board, for fitting into the first male connector, and a second female connector attached to the other face of the mother board opposite to the first female connector, and connected to the first female connector via a plurality of pins. Moreover, a second card inserted through the through hole of the constant temperature oven has a plurality of second signal lines connected to the device to be tested, formed on a surface thereof, and there is provided a second male connector attached to one edge of the second card and connected to the second signal lines, and fitted into the second female connector.

Since the device testing apparatus of the present invention is constructed in this way with the first female connector and the second female connector disposed opposite to each other, then compared to the conventional device testing apparatus, the signal transmission distance can be shortened. Consequently, with the present invention, compared to the conventional device testing apparatus, the signal delay time is shortened and the line capacity reduced, and hence signal transmission characteristics can be improved.

Furthermore, since the device testing apparatus of the present invention uses a second female connector and a second male connector, then compared to the case of the conventional edge connector, the contact reliability can be improved.

DESCRIPTION OF THE PREFERRED EMBODIMENT

Figure 2:
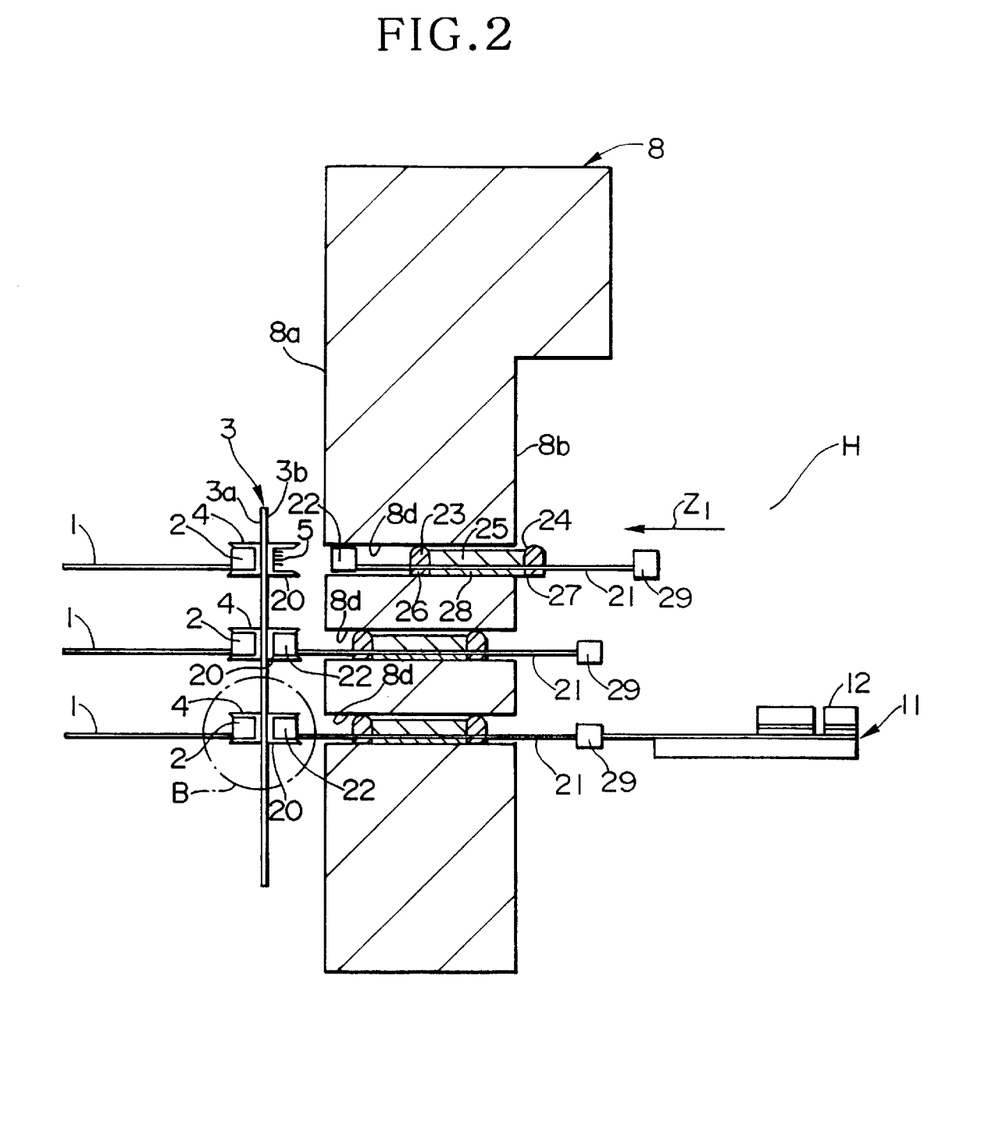
FIG. 2 is a side sectional view showing the construction of the main parts of the device testing apparatus according to the first embodiment of FIG. 1.
Figure 3:
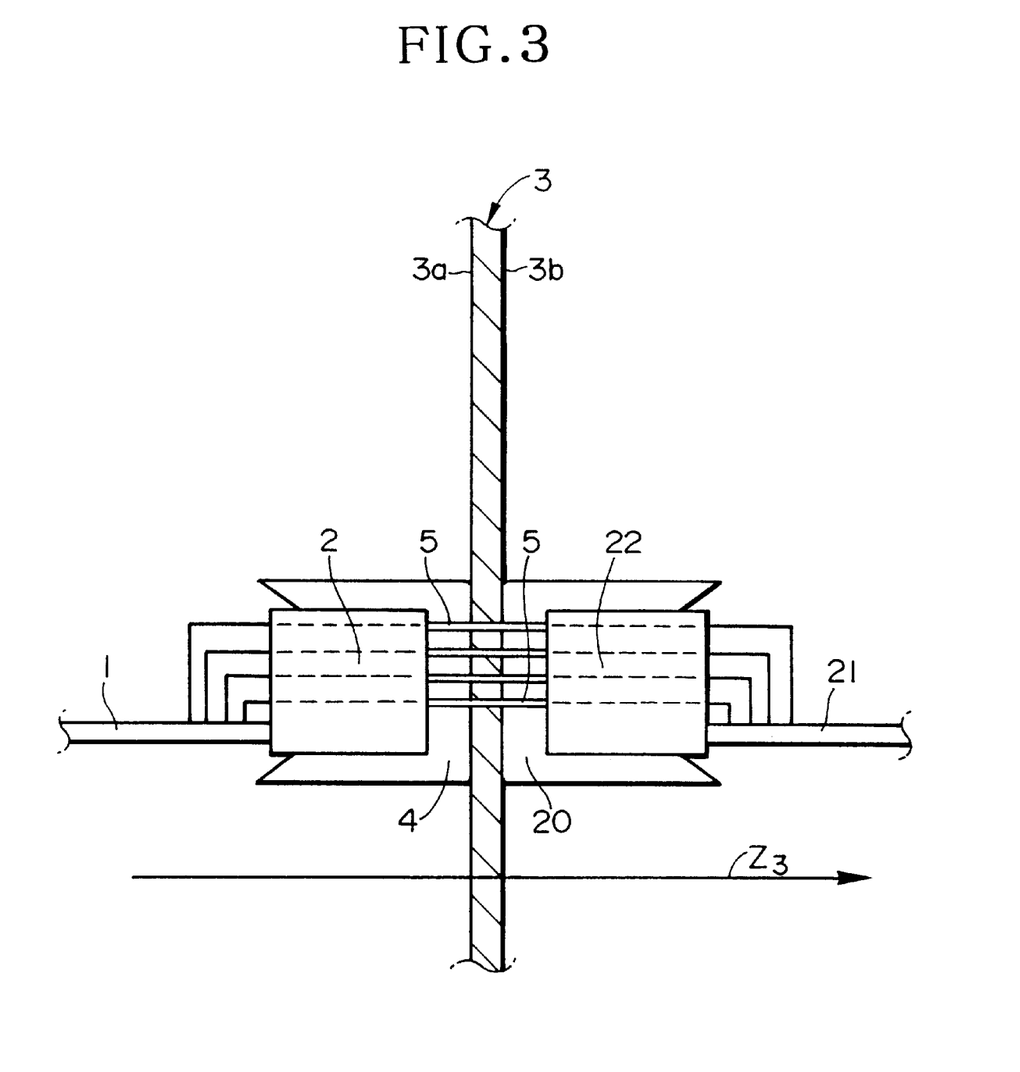
FIG. 3 is an enlarged side view showing the construction inside circle B in FIG. 2.

As follows is a description of an embodiment of the present invention with reference to the drawings. FIG. 1 is a partially cut away perspective view showing the construction of the main parts of a device testing apparatus according to an embodiment of the present invention. FIG. 2 is a side sectional view showing the construction of the device testing apparatus according to the first embodiment of the invention. FIG. 3 is an enlarged side view showing the construction inside circle B in FIG. 2.

In FIG. 1, FIG. 2 and FIG. 3, parts corresponding to the respective parts of FIG. 4, FIG. 5 and FIG. 6 are denoted by the same symbols and description is omitted.

In FIG. 1, FIG. 2 and FIG. 3 instead of the edge connectors 6 and the feed through boards 9 shown in FIG. 4, FIG. 5 and FIG. 6, there is provided female connectors 20 and feed through boards 21.

The female connectors 20 shown in FIG. 1 are respectively provided at positions opposite to the female connectors 4, and are respectively attached at uniform spacing to the other face 3b of the mother board 3. Here the female connector 20 is defined as a connector for which the molded shape is that of a female connector. Furthermore, the female connectors 20 shown in FIG. 2 are electrically connected to the male connectors 2 via pins 5. That is to say, the female connectors 20 and the female connectors 4 are provided in line and perpendicular to the motherboard 3.

The pins 5 are respectively provided in matrix form, that is to say two dimensionally, with the respective ends of the plurality of pins 5 arranged in matrix form protruding from the side face of the female connector 20. The feed through board 21 shown in FIG. 1 is of rectangular plate shape supported relative to the mother board 3, and has approximately the same area as the total face area of the three feed through boards 9 shown in FIG. 4.

With the feed through board 21, numerals 22 denote male connectors respectively provided corresponding to the female connectors 20, and respectively attached to one edge 21a of the feed through board 21. Here the male connector 22 is defined as a connector for which the molded shape is that of a male connector.

The male connectors 22 are electrically connected to a plurality of signal lines provided on the surface of the feed through board 21. Numeral 23 denotes a long shaped insulation member made for example from rubber, having thermal insulation properties. The insulation member 23 is affixed to the surface of the feed through board 21 close to the one edge 21a, using an adhesive or the like.

Numeral 24 denotes an insulation member of the same construction as the insulation member 23, which is parallelly disposed at a fixed spacing to the insulation member 23. The insulation member 24 is affixed to the surface of the feed through board 21 close to the other edge 21b, using an adhesive or the like.

Numeral 25 denotes a rectangular plate shape reinforcing member which is interposed between the insulation member 23 and the insulation member 24 so as to fill the space therebetween, and is affixed to the surface of the feed through board 21. The reinforcing member 25 serves the role of preventing the insulation member 23 and the insulation member 24 from coming away from the feed through board 21.

Numeral 26 denotes an insulation member of similar construction to the insulation member 23, provided corresponding to the insulation member 23. The insulation member 26 however is formed with a height less than that of the insulation member 23. Furthermore, the insulation member 26 is affixed to the back face of the feed through board 21 close to the edge 21a, using an adhesive or the like.

Numeral 27 denotes an insulation member of the same construction as the insulation member 26, which is parallelly disposed at a fixed spacing to the insulation member 26, and provided corresponding to the insulation member 24. The insulation member 27 is affixed to the back face of the feed through board 21 close to the other edge 21b, using an adhesive or the like.

Numeral 28 denotes a rectangular plate shape reinforcing member which is interposed between the insulation member 26 and the insulation member 27 so as to fill the space therebetween, and is affixed to the back face of the feed through board 21. The reinforcing member 28 serves the role of preventing the insulation member 26 and the insulation member 27 from coming away from the feed through board 21.

Numerals 29 denote edge connectors of the same construction as the edge connectors 10 (refer to FIG. 4), respectively attached to the other edge 21b of the feed through board 21 at uniform spacing.

Furthermore, with the constant temperature oven 8 shown in FIG. 2, instead of the through holes 8c shown in FIG. 5, through holes 8d are formed. The vertical dimension of the through holes 8d is slightly greater than the height of the male connectors 22, and slightly less than the distance between the upper edge of the insulation member 23 (insulation member 24) and the lower edge of the insulation member 26 (insulation member 27). Further, in FIG. 1, the drawing for the constant temperature oven 8 shown in FIG. 2 is omitted.

Next is a description of the operation of the device testing apparatus according to the above described embodiment of the present invention. In FIG. 1, the male connectors 2 of the DRV/CMP card 1 are respectively fitted into the female connectors 4. As a result, the DRV/CMP card 1 is supported relative to the mother board 3, and the signal lines shown in FIG. 3 formed on the surface of the DRV/CMP card 1, are electrically connected to the female connectors 20 via the male connectors 2, the female connectors 4 and the pins 5.

Then, the upper stage one of feed through boards 21 shown in FIG. 2 is inserted in the direction of arrow Z1 in FIG. 2, into the through hole 8d from the inner wall 8b side of the constant temperature oven 8. At the time of insertion, the insulation members 23, 24, 26 and 27 are respectively resiliently deformed as they are pushed into the through hole 8d.

Then the male connectors 22 of the feed through board 21 are fitted into the female connectors 20 as shown in FIG. 3. As a result, the feed through board 21 is supported relative to the other face 3b of the mother board 3, and the edge connectors 29 are electrically connected to the signal lines shown in FIG. 3 formed on the surface of the DRVICMP card 1, via the signal lines formed on the surface of the feed through board 21, the male connectors 22, the pins 5, and the male connectors 2.

Then the tongues 11a of the test burn-in board 11 shown in FIG. 1 are respectively inserted into the edge connectors 29. As a result, the devices to be tested 12 are respectively electrically connected to the edge connectors 29, via the signal lines formed on the surface of the test burn-in board 11.

Moreover, at the time of mounting the feed through board 21, the insulation members 23, 24, 26 and 27 shown in FIG. 2 are tightly fitted in a resiliently deformed condition to the inside walls of the through hole 8d. Consequently, in this condition, the inner space H of the constant temperature oven 8 is insulated from the outside by the insulation members 23, 24, 26 and 27. As a result, good air tightness and good thermal insulation for the constant temperature oven 8 is maintained.

In this connected condition, when a signal is supplied from a signal generator (not shown in the figure) to the signal lines formed on the surface of the DRV/CMP card 1, the signal is supplied to the devices to be tested 12 by way of a straight line path Z3 shown in FIG. 3.

That is to say, the signal is supplied to the devices to be tested 12 via the signal lines formed on the surface of the DRV/CMP card 1 shown in FIG. 3, the male connectors 2, the pins 5, the male connectors 22, the signal lines formed on the surface of the feed through board 21, the edge connectors 29 shown in FIG. 1, and the signal lines formed in the surface of the test burn-in board 11. In this way, testing is carried out with respect to the devices to be tested 12.

As described above, with the device testing apparatus according to the embodiment of the present invention, since instead of the conventional edge connectors 6 (refer to FIG. 6), the female connectors 20 and the male connectors 22 shown in FIG. 3 are used, then signal line connection in matrix form (a two dimensional array) is possible.

Consequently, with the device testing apparatus according to the above described embodiment, an increase in the number of signals which can be handled, and modification to the signal line array can be easily effected, and hence an improvement in signal extendibility is possible.

Furthermore, with the device testing apparatus according to the above described embodiment, since the female connectors 20 and the male connectors 22 are used, contact reliability can be improved compared to the case of the conventional edge connectors 6.

Moreover, with the device testing apparatus according to the above described embodiment, since the female connectors 4 and the female connectors 20 shown in FIG. 3 are connected in line by the pins 5, the signal transmission distance from the signal generator to the devices to be tested 12 can be shortened, compared to the conventional device testing apparatus.

Consequently, with the device testing apparatus according to the above described embodiment, compared to the conventional device testing apparatus, the signal delay time is shortened, and line capacity is reduced so that signal transmission characteristics can be improved.

In addition, with the device testing apparatus according to the above described embodiment, since the construction incorporates insulation members 23, 24, 26 and 27, then the air tightness and the insulation properties between the inner space H and the outer space for the constant temperature oven 8 can be improved.

The description of the device testing apparatus according to the embodiment of the present invention has been given with reference to the above drawings. However the specific construction is not limited to the above described embodiment, and design changes and the like which do not deviate from the gist of the present invention are included in the invention.

For example, with the device testing apparatus according to the embodiment, the construction has been described for where the air tightness and the insulation properties of the constant temperature oven 8 are maintained by affixing the insulation members 23, 24, 26 and 27 shown in FIG. 2 to the feed through board 21. However the invention is not limited to this.

That is to say, with the device testing apparatus according to the above described embodiment, a construction is possible where a feed through board 21 which is not provided with the insulation members 23, 24, 26 and 27, and the reinforcing members 25 and 28 is used, and after fitting the male connectors 22 of the feed through board 21 into the female connectors 20, the gap between the through hole 8d of the constant temperature oven 8 and the feed through board 21 is sealed with a sealing member of rubber or the like.

What is claimed is:

1. A device testing apparatus having a constant temperature oven in which a through hole is formed passing from an outer wall to an inner wall, for maintaining an inner space at a constant temperature, and a test burn-in board on which a plurality of devices to be tested are mounted, provided inside said constant temperature oven, wherein the device testing apparatus comprising:

a first card having a plurality of first signal lines for inputting a signal to be supplied to said device to be tested, formed on a surface thereof;

a first male connector attached to one edge of said first card and connected to said plurality of first signal lines;

a motherboard;

a first female connector attached to one face of said mother board for fitting into said first male connector;

a second female connector attached to the other face of said mother board opposite to said first female connector, and connected to said first female connector via a plurality of pins;

a second card inserted through the through hole of said constant temperature oven and having a plurality of second signal lines connected to said device to be tested, formed on a surface thereof; and     a second male connector attached to one edge of said second card and connected to said second signal lines, and fitted into said second female connector.

2. A device testing apparatus according to claim 1, further comprising:

a first insulation member affixed to a surface of said second card so as to fill a gap between a surface of said second card and an inner wall of said through hole; and     a second insulation member affixed to a back face of said second card so as to fill a gap between the back face of said second card and an inner wall of said through hole.

3. A device testing apparatus according to claim 2, further comprising:

a third insulation member affixed to a surface of said second card correspondingly disposed at a fixed spacing to said first insulation member, so as to fill a gap between a surface of said second card and an inner wall of said through hole; and     a fourth insulation member affixed to a back face of said second card correspondingly disposed at a fixed spacing to said second insulation member, so as to fill a gap between the back face of said second card and an inner wall of said through hole.

4. A device testing apparatus according to claim 3, further comprising:

a first reinforcing member affixed to a surface of said second card and interposed between said first insulation member and said third insulation member so as to fill a space therebetween; and a second reinforcing member affixed to a back face of said second card and interposed between said second insulation member and said fourth insulation member so as to fill a space therebetween.

5. A device testing apparatus according to claim 1, further comprising:

a sealing member for sealing a gap between said second card and an inner wall of said through hole when said second card is inserted into said through hole and said second male connector is fitted into said second female connector.

6. A device testing apparatus according to claim 1, wherein said plurality of pins are provided in a matrix form.

7. A device testing apparatus according to claim 6, further comprising:

a first insulation member affixed to a surface of said second card so as to fill a gap between a surface of said second card and an inner wall of said through hole; and a second insulation member affixed to a back face of said second card so as to fill a gap between the back face of said second card and an inner wall of said through hole.

8. A device testing apparatus according to claim 7, further comprising:

a third insulation member affixed to a surface of said second card correspondingly disposed at a fixed spacing to said first insulation member, so as to fill a gap between a surface of said second card and an inner wall of said through hole; and a fourth insulation member affixed to a back face of said second card correspondingly disposed at a fixed spacing to said second insulation member, so as to fill a gap between the back face of said second card and an inner wall of said through hole.

9. A device testing apparatus according to claim 8, further comprisng:

a first reinforcing member affixed to a surface of said second card and interposed between said first insulation member and said third insulation member so as to fill a space therebetween; and a second reinforcing member affixed to a back face of said second card and interposed between said second insulation member and said fourth insulation member so as to fill a space therebetween.

10. A device testing apparatus according to claim 6, further comprising:

a sealing member for sealing a gap between said second card and an inner wall of said through hole when said second card is inserted into said through hole and said second male connector is fitted into said second female connector.

* * * * *